(12) United States Patent
Taniguchi et al.

(10) Patent No.: US 7,678,695 B2
(45) Date of Patent: Mar. 16, 2010

(54) CIRCUIT SUBSTRATE AND METHOD FOR FABRICATING THE SAME

(75) Inventors: Osamu Taniguchi, Kawasaki (JP); Yasuo Yamagishi, Kawasaki (JP); Koji Omote, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 136 days.

(21) Appl. No.: 11/714,777

(22) Filed: Mar. 7, 2007

(65) Prior Publication Data

US 2007/0155174 A1    Jul. 5, 2007

Related U.S. Application Data

(62) Division of application No. 10/336,728, filed on Jan. 6, 2003, now Pat. No. 7,211,899.

(30) Foreign Application Priority Data

Jan. 18, 2002    (JP)    ............................ 2002-009442

(51) Int. Cl.
*H01L 21/44*    (2006.01)
(52) U.S. Cl. .................. 438/667; 257/E21.585
(58) Field of Classification Search ................. 438/667; 257/E21.585
See application file for complete search history.

(56) References Cited

U.S. PATENT DOCUMENTS

| | | | |
|---|---|---|---|
| 4,254,172 A | 3/1981 | Takahashi et al. | 428/131 |
| 4,360,570 A | 11/1982 | Andreades et al. | 428/596 |
| 5,454,927 A | 10/1995 | Credle et al. | 205/123 |
| 5,510,655 A | 4/1996 | Tanielian | 257/774 |
| 5,718,367 A | 2/1998 | Covell et al. | 228/254 |
| 5,865,934 A | 2/1999 | Yamamoto et al. | 156/295 |
| 6,077,766 A | 6/2000 | Sebesta et al. | 438/618 |
| 6,153,505 A | 11/2000 | Bolde et al. | 438/613 |
| 6,291,776 B1 | 9/2001 | Markovich et al. | 174/262 |
| 6,312,791 B1 | 11/2001 | Fasano et al. | 428/210 |
| 6,653,170 B1 | 11/2003 | Lin | 438/117 |
| 2002/0046880 A1 | 4/2002 | Takubo et al. | 174/261 |
| 2002/0100608 A1 | 8/2002 | Fushie et al. | 174/255 |
| 2002/0180027 A1 | 12/2002 | Yamaguchi et al. | 257/700 |

FOREIGN PATENT DOCUMENTS

| | | |
|---|---|---|
| JP | 3-67471 | 7/1991 |
| JP | 04-154187 | 5/1992 |
| JP | 4-154187 | 5/1992 |

(Continued)

OTHER PUBLICATIONS

Korean Office Action dated Dec. 14, 2007.

*Primary Examiner*—David S Blum
(74) *Attorney, Agent, or Firm*—Kratz, Quintos & Hanson, LLP

(57) ABSTRACT

A circuit substrate comprises a glass substrate 16, through-holes 18 formed through the glass substrate 16 and via electrodes 20 buried in the through-holes 18. An opening width of the through-holes 18 is minimum inside the glass substrate and is increased toward both surfaces of the glass substrate 16. Accordingly, the detachment of the via electrodes 20 can be prevented without increasing the surface roughness of the inside walls of the through holes, and stresses generated in the core substrate can be mitigated.

10 Claims, 9 Drawing Sheets

FOREIGN PATENT DOCUMENTS

| | | |
|---|---|---|
| JP | 06077347 A | 3/1994 |
| JP | 08-148782 | 6/1996 |
| JP | 8-148782 | 6/1996 |
| JP | 10321986 A | 12/1998 |
| JP | 2000-216514 | 8/2000 |
| JP | 2001-105398 | 4/2001 |

CIRCUIT SUBSTRATE AND METHOD FOR FABRICATING THE SAME

CROSS-REFERENCE TO RERATED APPLICATION

This application is a divisional application of Ser. No. 10/336,728 filed Jan. 6, 2003, now U.S. Pat. No. 7,211,899, which is based upon and claims priority of Japanese Patent Application No. 2002-9442, filed on Jan. 18, 2002, the contents being incorporated herein by reference.

BACKGROUND OF THE INVENTION

The present invention relates to a circuit substrate and a method for fabricating the circuit substrate which are adaptable to higher density and higher speed.

Recently, semiconductor parts used in computers, etc. are rapidly made increasingly adaptable to higher density and higher speed. Circuit substrates as well are accordingly required to be adaptable to the higher density and the higher speed.

One example of the conventional circuit substrates will be explained with reference to FIGS. 9A and 9B. FIG. 9A is a sectional view of the mounted conventional circuit substrate, which shows the structure of the circuit substrate. FIG. 9B is a perspective view of the circuit substrate, which shows the structure of the circuit substrate.

As shown in FIG. 9A, the circuit substrate 100 is mounted on a printed circuit board 106. The circuit substrate 100 and the printed circuit board 106 are electrically connected to each other via solder balls 104a, etc. Decoupling capacitors 108 are formed on the upper surface of the circuit substrate 100. An LSI substrate 110 is mounted on the circuit substrate 100 mounted on the printed circuit board 106. The circuit substrate 100 and the LSI substrate 110 are electrically connected to each other via solder balls 104b, etc.

As shown in FIG. 9B, through-holes 114 are formed in the circuit substrate 100 at a certain pitch. Via electrodes 116 of a metal are buried in the through-holes 114. Usually, passive elements, active elements, etc., such as decoupling capacitors, etc., are formed on the circuit substrate 100 mounted on the printed circuit board 106. In FIG. 9B, these elements, etc. are omitted.

Prescribed wiring of the LSI substrate 110 and prescribed wiring of the printed circuit board 106 are electrically connected via the via electrodes 116, electrode pads 102a, 102b and solder balls 104a, 104b.

In the above-described conventional circuit substrate, when the adhesion between the via electrodes of the buried metal and the inside walls of the through-holes is insufficient, the via electrodes often come off. In order to increase the adhesion between the via electrodes and the inside walls of the through-holes, the surface roughness of the inside walls of the through-holes are increased, whereby the detachment of the via electrodes are prevented.

However, when a base material of the circuit substrate is a conducting substrate, such as a silicon substrate or others, the rough inside walls of the through-holes tends to cause leak current. That is, when a conducting substrate is used, an insulation film is formed on the inside walls of the through-holes to ensure the insulation between the via electrodes and the substrate. In this case, when the surface roughness of the inside walls of the through-holes is increased, electric fields are concentrated on the insulation film and the dielectric breakdown is occurred. Resultantly, leak current more tends to be caused.

As a result of increasing the surface roughness of the inside walls of the through-holes, processing strains are present in the inside walls of the through-holes, etc. Resultantly, cracks tend to take place in the circuit substrate.

Furthermore, a metal, etc. whose thermal expansion coefficients are different from that of the substrate is buried in the through-holes, which causes stresses in the substrate. These stresses are a cause for damaging the circuit substrate. However, it is difficult for the conventional circuit substrate to mitigate the stresses caused therein.

SUMMARY OF THE INVENTION

An object of the present invention is to provide a circuit substrate which can prevent the detachment of the via electrodes without increasing surface roughness of the inside walls of the through-holes, and can mitigate stresses caused in the substrate, and a method for fabricating the circuit substrate.

According to one aspect of the present invention, there is provided a circuit substrate comprising a core substrate, a through-hole formed through the core substrate, and a via electrode buried in the through-hole, an opening width of the through-hole being minimum inside the core substrate and increased toward both surfaces of the core substrate.

According to another aspect of the present invention, there is provided A method for fabricating a circuit substrate comprising the steps of forming a through-hole in a core substrate and burying a via electrode in the through-hole, in the step of forming the through-hole, the through-hole being formed so that an opening width of the through-hole being minimum inside the core substrate and increased toward both surfaces of the core substrate.

As described above, in the circuit substrate according to the present invention, which comprises the core substrate, the through-holes formed through the core substrate, and the via electrodes buried in the through-holes, an opening width of the through-holes is minimum inside the core substrate and is increased toward both surfaces of the core substrate, whereby the detachment of the via electrodes can be prevented without increasing the surface roughness of the inside walls of the through hole, and stresses generated in the core substrate can be mitigated.

According to the present invention, it is not necessary to increase the surface roughness of the inside walls of the through-holes for the prevention of the detachment of the via electrodes, whereby in a case that the core substrate is a conducting substrate, the insulation between the via electrodes and the core substrate can be ensured, and the generation of leak current can be suppressed.

DETAILED DESCRIPTION OF THE INVENTION

Principle of the Invention

The principle of the circuit substrate according to the present invention will be explained with reference to FIGS. 1A, 1B, 1C, and 1D are sectional views of a substrate 10, which show through-holes 12a-12d, explaining the principle of the circuit substrate according to the present invention. Via electrodes 14a-14d are buried in the respective through-holes 12a-12d.

Figure 1A:
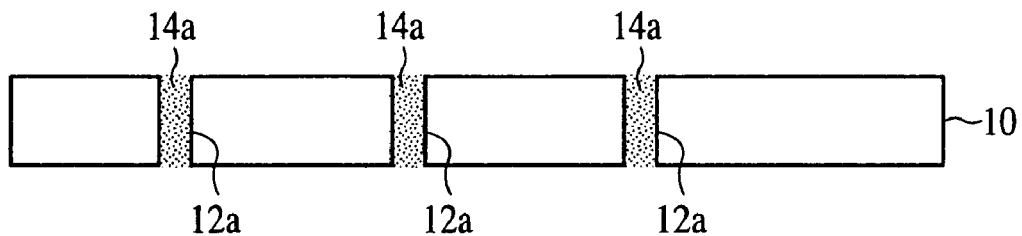
FIGS. 1A, 1B, 1C, and 1D are views explaining the principle of the invention.

In the conventional circuit substrate, as shown in FIG. 1A, the inside walls of the through-holes 12a with the via electrodes 14a buried in are substantially perpendicular to the plane of the substrate 10. For the purpose of preventing the detachment of the via electrodes 14a buried in the through-holes 12a, the inside walls of the through-holes 12a have the surface roughness increased.

In a case that the substrate 10 is formed of a conducting substrate, such as a silicon substrate or others, an insulation film is formed on the inside walls of the through-holes 12a to insulate the substrate 10 from the via electrodes 14a. However, the increased surface roughness of the inside walls of the through-holes for the prevention of the detachment of the via electrodes 14a makes it difficult to ensure the insulation. Resultantly, leak current tends to take place.

The increased surface roughness of the inside walls of the through-holes 12a causes processing strains, which tends to cause cracks, etc. in the substrate 10.

Thus, a method for preventing the detachment of the via electrodes without increase the surface roughness of the inside walls of the through-holes is required.

Figure 1B:
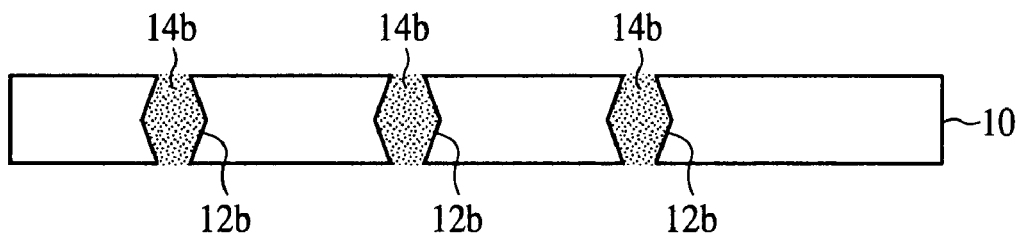

In one possible method for preventing the detachment of the via electrodes without increasing the surface roughness of the inside walls of the through-holes, as shown in FIG. 1B, an opening width of the through-holes 12b is maximum at a prescribed position inside the substrate 10 and is decreased toward both surfaces of the substrate 10, so that the via electrodes 14 buried in the through-holes 12b never come off.

However, when a metal is buried in the through-holes 12b of the configuration shown in FIG. 1B, forming the via electrodes 14b, stresses in the direction of thickness of the substrate 10 cannot be mitigated but are rather concentrated. Accordingly, when the circuit substrate is jointed to substrates such as mounting LSI chips or being mounted on a printed circuit board, cracks will tend to be caused. Actually, it is difficult to bury a metal in the through-holes 12b of the configuration shown in FIG. 1B to form the via electrodes 14b.

Figure 1C:
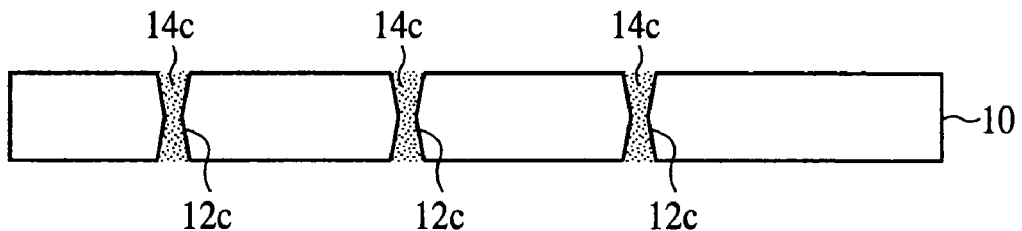

As shown in FIG. 1C, an opening width of the through-holes 12c could be minimum at a prescribed position inside the substrate 10 and is increased toward both surfaces of the substrate 10. A metal is buried in the through-holes 12c of such configuration, forming the via electrodes 14c, whereby the opening width of the through-holes 12c is decreased inside the substrate 10, whereby the via electrodes 14c never come off.

The configuration shown in FIG. 1C can mitigate stresses generated in the substrate 10 by burying a metal in the through-holes 12c. Furthermore, the configuration shown in FIG. 1C permits a metal to be buried easily into the through-holes 12c by sputtering, CVD (chemical vapor deposition), plating or other means to form the via electrodes 14c.

Figure 1D:
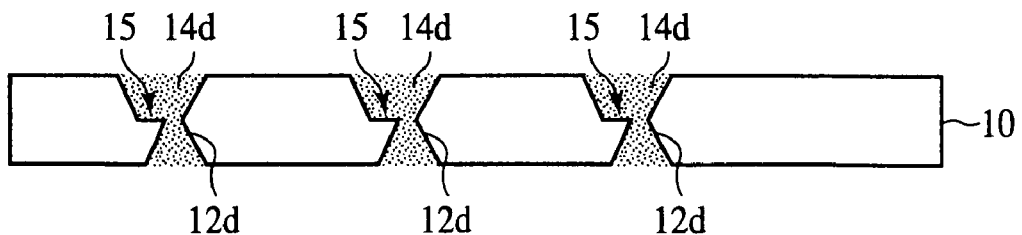

As shown in FIG. 1D, the through-holes 12d having an opening width which is minimum at a prescribed position inside the substrate 10 and increased toward both surfaces of the substrate, and having the inside walls including planes 15 formed substantially parallel to the surfaces of the substrate 10 also have the same effect as the through-holes 12c shown in FIG. 1C. Because of the planes 15 substantially parallel to the surfaces of the substrate 10, which are formed in the inside walls of the through-holes 12d, the through-holes 12d can effectively prevent the detachment of the via electrodes 14d.

Then, in the present invention, an opening width of the through-holes with the via electrodes buried in reduced inside the substrate and is increased toward the surfaces of the substrate, whereby the detachment of the via electrodes can be prevented without increasing the surface roughness of the inside walls of the through-holes. The inside walls of the through-holes are not required to be roughened, whereby even in a case where a conducting substrate is used, the insulation between the via electrodes and the substrate can be ensured, and the generation of leak current can be prevented. Furthermore, strains generated in the circuit substrate can be mitigated.

A FIRST EMBODIMENT

Figure 2A:
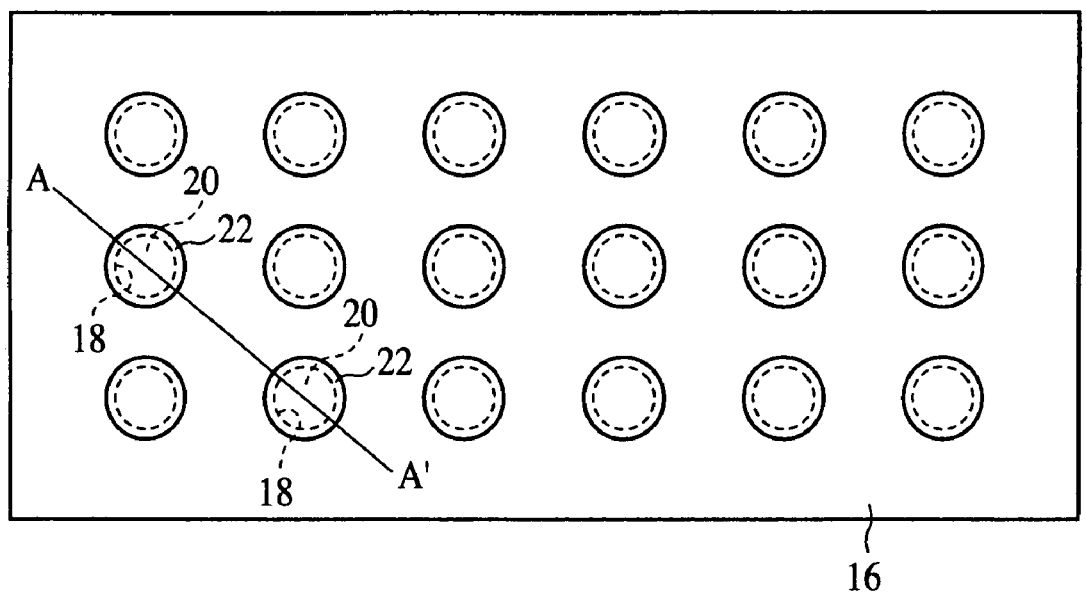
FIGS. 2A and 2B are diagrammatic views of the circuit substrate according to a first embodiment of the present invention, which show a structure thereof.
Figure 2B:
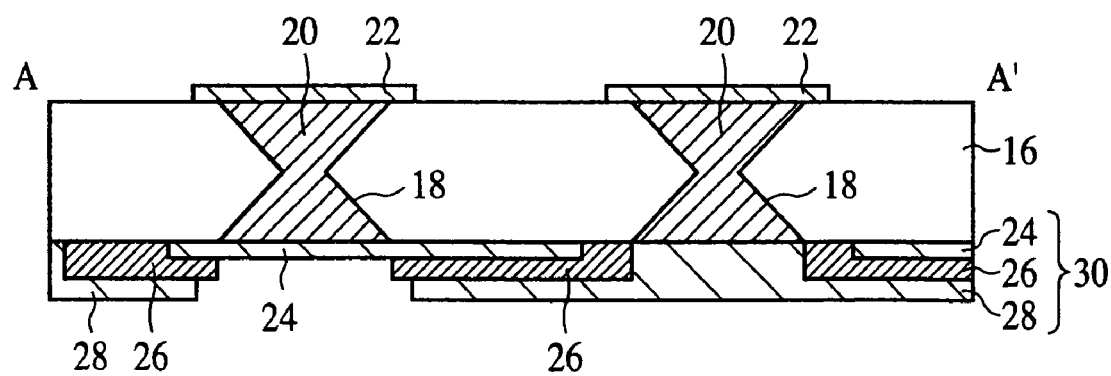

The circuit substrate according to a first embodiment of the present invention will be explained with reference to FIGS. 2A, 2B, 3A, 3B, 3C, 3D, 4A, 4B, and 4C. FIGS. 2A and 2B are diagrammatic views of the circuit substrate according to the present embodiment, which show a structure thereof. FIGS. 3A, 3B, 3C, 3D, 4A, 4B, and 4C are sectional views of the circuit substrate according to the present embodiment in the steps of the method for fabricating the circuit substrate, which show the method.

First, the structure of the circuit substrate according to the present embodiment will be explained with reference to FIGS. 2A and 2B. FIG. 2A is a top view of the circuit substrate according to the present embodiment. FIG. 2B is a sectional view along the line A-A' in FIG. 2A.

As shown in FIGS. 2A and 2B, through-holes 18 are formed in a 500 µm-thickness glass substrate 16 at a prescribed pitch. A shape of the through-holes 18 as viewed perpendicularly to plane of the glass substrate 16 is circular.

As shown in FIG. 2B, an opening width of each through-hole 18 is minimum inside the glass substrate 16 near the thickness-wise middle thereof. For example, an opening width of each through-hole 18 is 80 µm which is minimum inside the glass substrate 16 near the thickness-wise middle thereof and is increased to 400 µm at both surfaces of the glass substrate 16. Thus, the through-holes 18 have a shape of a hand drum (used in traditional Japanese music).

Via electrodes 20 of Pt are buried in the respective through-holes 18.

Electrode pads 22 of a layer film of a 1 µm-thickness Cu film, a 200 nm-thickness Ni film and a 50 µm-thickness Au film are formed on the respective via electrodes 20 at the upper surface of the glass substrate 16. The respective electrodes pads 22 are formed in, e.g., a 500 μm-circle.

Electrodes 24 of a 0.2 μm-thickness Pt film are formed on the back side of the glass substrate 16, connected to the via electrodes 20. A dielectric film 26 of a 0.2 μm-thickness BST ($Ba_xSr_{1-x}TiO_3$) is formed on the back sides of the electrodes 24. Electrodes 28 of a 0.2 μm-thickness Pt film are formed on the under side of the dielectric film 26. Thus, capacitors 30 including the dielectric film 26 sandwiched between the electrodes 24 and the electrodes 28 are formed on the under side of the glass substrate 16.

The circuit substrate according to the present embodiment is thus constituted.

In the mounted state, for example, solder balls (not shown) are formed on the electrode pads 22 on the upper surface of the circuit substrate according to the present embodiment, and an LSI substrate (not shown) is mounted via the electrode pads 22 and the solder balls.

On the under side of the circuit substrate according to the present embodiment, pads and solder balls (not shown) are formed. The circuit substrate according to the present embodiment is mounted on a printed circuit board (not shown) via the pads and the solder balls formed on the under side of the circuit substrate according to the present embodiment.

Prescribed wring of the printed circuit board and prescribed wiring of the LSI substrate are electrically connected to each other via the via electrodes 20.

The circuit substrate according to the present embodiment is characterized mainly in that an opening width of the through-holes 18 is minimum inside the glass substrate 16 near the thickness-wise middle thereof and increased toward both surfaces of the glass substrate 16, whereby the detachment of the via electrodes 20 can be prevented without increasing the surface roughness of the inside walls of the through-holes 18. Strains generated in the glass substrate 16 by burying the metal in the through-holes 18 to thereby form the via electrodes 20 can be mitigated.

If a minimum opening width of the through-holes 18 described above is too small in comparison with an opening width of the through-holes 18 near both surfaces of the glass substrate 16, the via electrodes 20 will tend to break off. Oppositely, if a minimum opening width of the through-holes 18 is too large, a configuration of the through-holes 18 will be substantially the same as that of the through-holes of the conventional circuit substrate. Resultantly, the detachment of the via electrodes 20 will not be able to be effectively prevented, and the stress mitigation will not be sufficient.

Accordingly, it is preferable that a sectional area of the via electrodes 20 at the position where the opening width of the through-holes 18 is minimum is within a range of 30-80% of a sectional area of the via electrodes 20 near both surfaces of the glass substrate 16.

Then, the method for fabricating the circuit substrate according to the present embodiment will be explained with reference to FIGS. 3A, 3B, 3C, 4A, 4B, and 4C.

First, dry films 32 are formed on both surfaces of a 500 μm-thickness glass substrate 16.

Figure 3A:
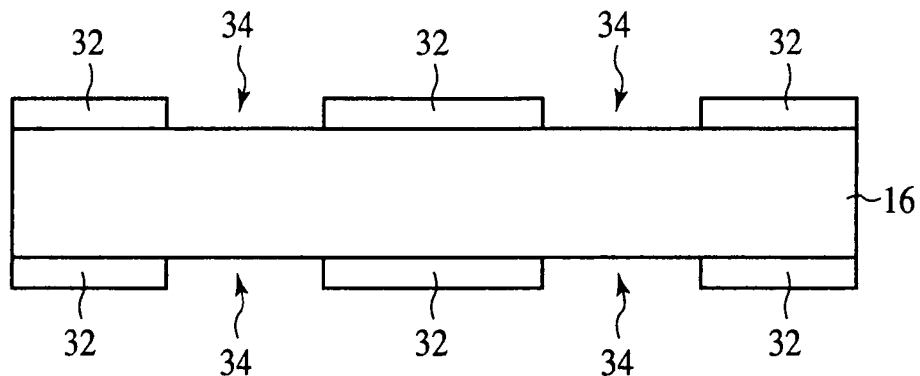
FIGS. 3A, 3B, 3C, and 3D are sectional views of the circuit substrate according to the first embodiment in the steps of the method for fabricating the circuit substrate, which show the method (Part 1).

Openings 34 are formed in the respective dry films 32 respectively down to the surfaces of glass substrate 16 (FIG. 3A). At this time, the openings 34 formed in the dry film 32 on the upper surface of the glass substrate 16 and the openings 34 formed in the dry film 32 on the back side of the glass substrate 16 are formed in alignment with each other. The openings 34 can have a shape of, e.g., a 400 μm-diameter circle.

Next, with the dry films 32 with the openings 34 formed in as a mask, abrasive grains are blasted from both sides of the glass substrate 16 by sand blasting. Then, the glass substrate 16 in the region exposed through the openings 34 of the dry films 32 are abraded. At this time, a diameter of the abraded parts is decreased gradually away from the surfaces of the glass substrate 16.

Figure 3B:
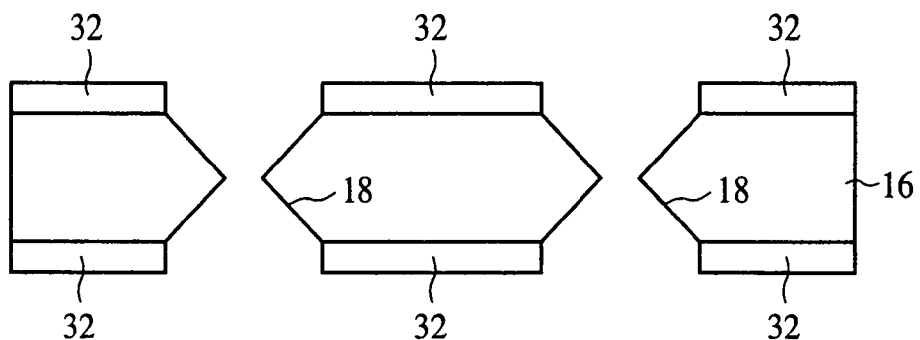

By blasting the abrasive grains, the abraded parts of the glass substrate 16 through the openings 34 on the upper side come to be connected with the corresponding abraded parts of the glass substrate through the openings 34 on the back side inside the glass substrate 16 near the thickness-wise middle thereof. Thus, the through-holes 18 are formed in the glass substrate 16 (FIG. 3B).

In the sand blasting, as described above, abrasive grains are blasted to abrade the glass substrate 16 to form the through-holes 18, and processing strains are undesirably generated in the inside walls of the through-holes 18. In order to make the processing strains minimum, in abrading the glass substrate 16, diameters of the abrasive grains are suitably changed to use smaller diameter abrasive grains for the finish.

The processing strains may be removed by etching the through-holes 18 formed by the sand blasting. The surface roughness of the inside walls of the through-holes 18 can be thus further decreased.

Then, with the dry films 32 left on both surfaces of the glass substrate 16, a metal, such as Pt or others, is buried in the through-holes 18 by sputtering, etching or other processing. For example, a seed layer of Ni is formed on the inside walls of the through-holes 18 by electroless plating, and then a metal film of Pt is grown by electrolytic plating. Thus, the metal is buried in the through-holes 18.

Figure 3C:
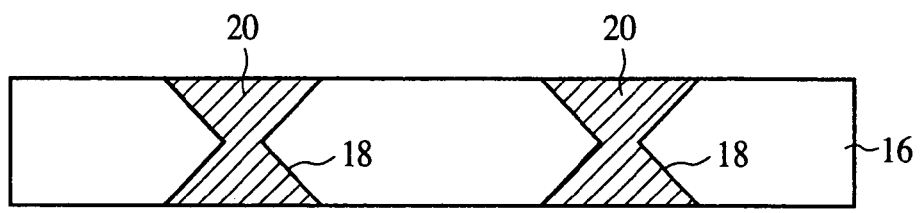

After the through-holes 18 have been filled with the metal, the dry films 32 on both sides of the glass substrate 16 are removed. Next, both surfaces of the glass substrate 16 are polished to remove excess of the metal except the metal which has been buried in the through-holes 18. Thus, the via electrodes 20 are formed in the through-holes 18 (FIG. 3C).

Then, a 0.2 μm-thickness Pt film is formed by sputtering on the back side of the glass substrate 16 with the via electrodes 20 formed in. At this time, the Pt film may be formed after a base layer of Ti, $TiO_2$, Ir, $IrO_2$ or others has been formed on the back side of he glass substrate 16, whereby the adhesion between the Pt film and the glass substrate 16 can be improved.

Figure 3D:
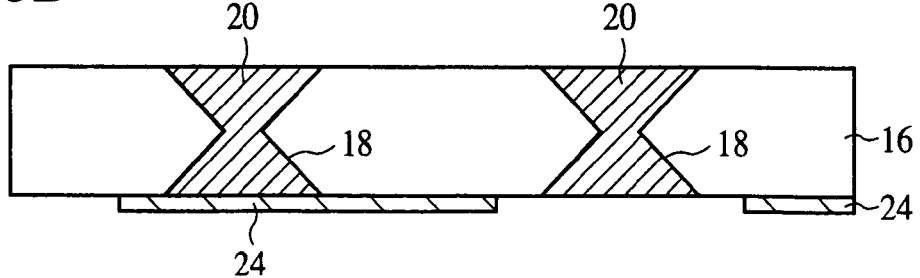

Next, the Pt film formed on the back side of the glass substrate 16 is patterned in a prescribed configuration by photolithography. Thus, the electrodes 24 of Pt are formed (FIG. 3D).

Figure 4A:
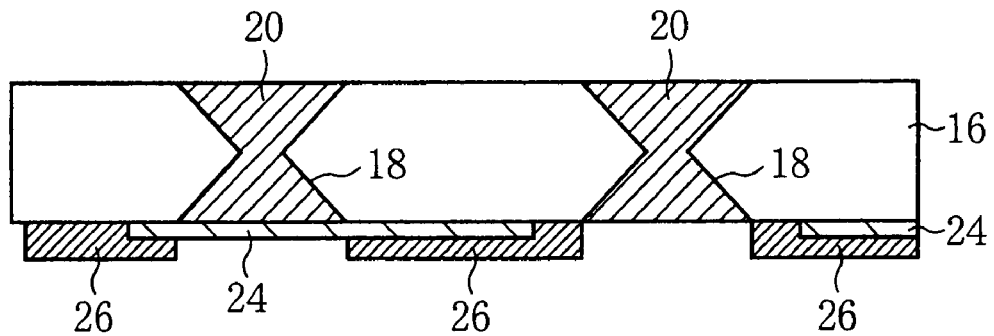
FIGS. 4A 4B, and 4C are sectional views of the circuit substrate according to the first embodiment in the steps of the method for fabricating the circuit substrate, which show the method (Part 2).

Then, a BST film is formed by sol-gel process on the back side of the glass substrate 15 with the electrodes 24 formed on. Next, the BST film is patterned in a prescribed configuration by photolithography. Thus, the dielectric film 26 of the BST is formed (FIG. 4A).

Figure 4B:
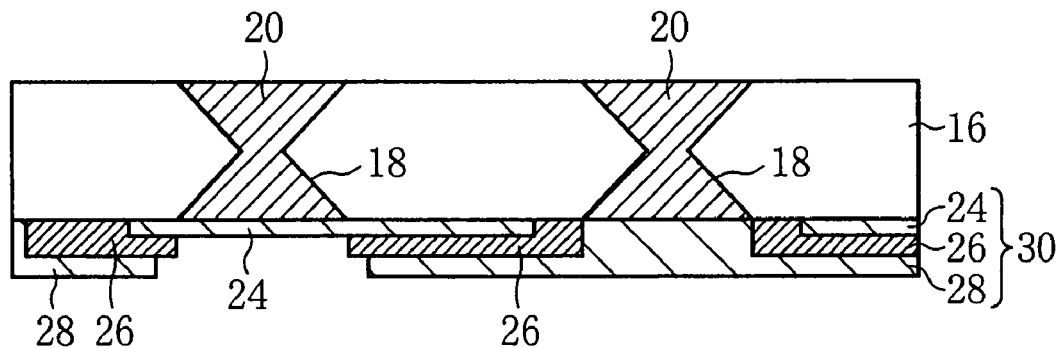

Then, a Pt film is formed by sputtering on the back side of the glass substrate 16 with the dielectric film 26 formed on. Next, the Pt film is patterned into a prescribed configuration by photolithography. Thus, the electrodes 28 of Pt are formed. The capacitors 30 including the dielectric film 26 sandwiched by the electrodes 24 and the electrodes 28 are thus formed on the back side of the glass substrate 16 (FIG. 4B).

Then, a 1 μm-thickness Cu film, a 200 nm-thickness Ni film and a 50 nm-thickness Au film are sequentially formed on the upper surface of the glass substrate 16.

Figure 4C:
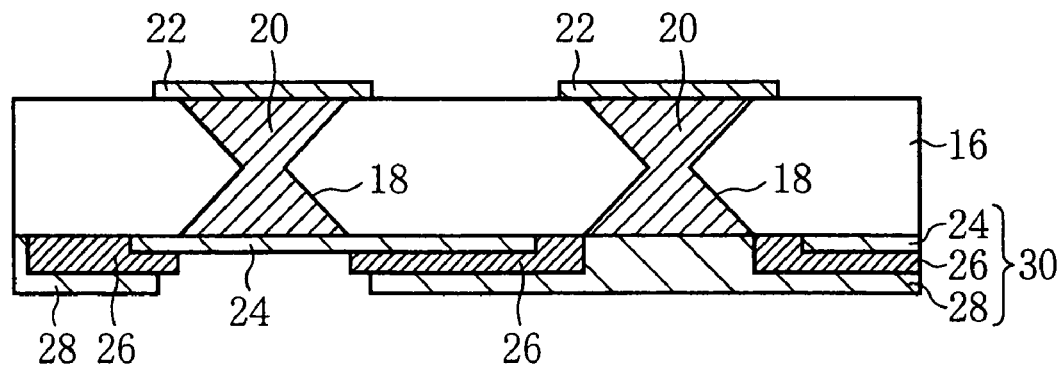

Then, the layer film of the Cu film, the Ni film and the Au film is patterned in a prescribed configuration. Thus, the electrode pads 22 of the layer film of the Cu film, the Ni film and the Au film are formed on the via electrodes 20 (FIG. 4C).

As described above, the circuit substrate according to the present embodiment is fabricated.

As described above, according to the present embodiment, an opening width of the through-holes 18 is minimum inside the glass substrate 16 near the thickness-wise middle thereof and is increased toward both surfaces of the glass substrate 16, whereby the detachment of the via electrodes 20 can be prevented without increasing the surface roughness of the inside walls of the through-holes 18. Stresses generated in the glass substrate 16 by burying the metal in the through-holes 18 to thereby form the via electrodes 20 can be mitigated.

A SECOND EMBODIMENT

Figure 5:
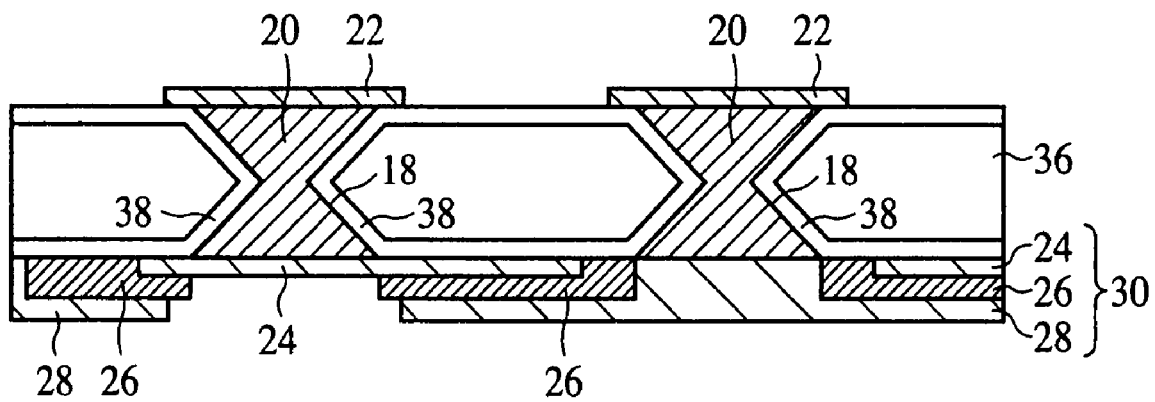
FIG. 5 is a sectional view of the circuit substrate according to a second embodiment of the present invention, which shows a structure thereof.

The circuit substrate according to a second embodiment of the present invention will be explained with reference to FIG. 5. FIG. 5 is a sectional view of the circuit substrate according to the present embodiment. The same members of the present embodiment as those of the circuit substrate according to the first embodiment and the method for fabricating the circuit substrate are represented by the same reference numbers not to repeat or to simplify their explanation.

As shown in FIG. 5, the circuit substrate according to the present embodiment uses a silicon substrate 36 in place of the glass substrate 10 of the circuit substrate according to the first embodiment.

An insulation film of a 1 µm-thickness silicon oxide film is formed on both surfaces of the silicon substrate 36 and on the inside walls of through-holes 18.

In the circuit substrate according to the present embodiment, the insulation between the conducting silicon substrate 36 and the via electrodes 20 is ensured by the insulation film 38 formed on the inside walls of the through-holes 18.

In the conventional circuit substrate, for the prevention of the detachment of via electrodes buried in the through-holes, the surface roughness of the inside walls of the through-holes must be increased. Accordingly, when the substrate is conducting, the surface roughness of the inside walls on which the insulation film is formed must be increased, which makes it difficult to sufficiently ensure the insulation between the via electrodes and the substrate.

On the other hand, in the circuit substrate according to the embodiment, an opening width of the through-holes 18 formed in the silicon substrate 36 is minimum inside the silicon substrate 36 near the thickness-wise middle thereof and is increased toward both surfaces of the silicon substrate 36, whereby the detachment of the via electrodes 20 can be prevented without increasing the surface roughness of the inside walls of the through-holes 18. The surface roughness of the inside walls of the through-holes 18 may not be increased as described above, whereby the insulation between the silicon substrate 36 and the via electrodes 20 can be sufficiently ensured by the insulation film formed on the inside walls of the through-holes 18. Accordingly, the generation of leak current can be prevented.

Next, the method for fabricating the circuit substrate according to the present embodiment will be explained.

First, a silicon substrate 36 is thermally oxidized to form the insulation film 38 of the 1 µm-thickness silicon oxide film on both surfaces of the silicon substrate 36.

Next, in the same way as in the first embodiment, the through-holes 18 are formed in the silicon substrate 36 with the insulation film 38 formed on both surfaces.

After the through-holes 18 have been formed, the silicon substrate 36 is thermally oxidized to form the insulation film 38 of the 1 µm-thickness silicon oxide film on the inside walls of the through-holes 18.

Then, in the same way as in the first embodiment, the metal is buried in the through-holes 18 with the insulation film 38 formed on to form the via electrodes 20. Next, capacitors 30 are formed on the back side of the silicon substrate 36, and the electrode pads 22 are formed on the upper surface.

Thus, the circuit substrate according to the present embodiment is thus fabricated.

As described above, according to the present embodiment, a sectional area of the through-holes 18 as viewed perpendicularly to the silicon substrate 36 is minimum inside the silicon substrate 36 near the thickness-wise middle thereof and is increased toward both surfaces of the silicon substrate 36, whereby the detachment of the via electrodes 20 is prevented without increasing the surface roughness of the inside walls of the through-holes 18. It is not necessary to increase the surface roughness of the inside walls of the through-holes 18 with the insulation film 38 formed on, whereby the insulation between the silicon substrate 36 and the via electrodes 20 can be ensured, and the generation of leak current can be prevented. Furthermore, stresses generated by burying the metal into the through-holes 18 to thereby form the via electrodes 20 can be mitigated.

In the present embodiment, the insulation film 38 is formed of silicon oxide to ensure the insulation. However, a material of the insulation film 38 is not limited to silicon oxide, and silicon nitride or others, for example, can be used.

A THIRD EMBODIMENT

Figure 6:
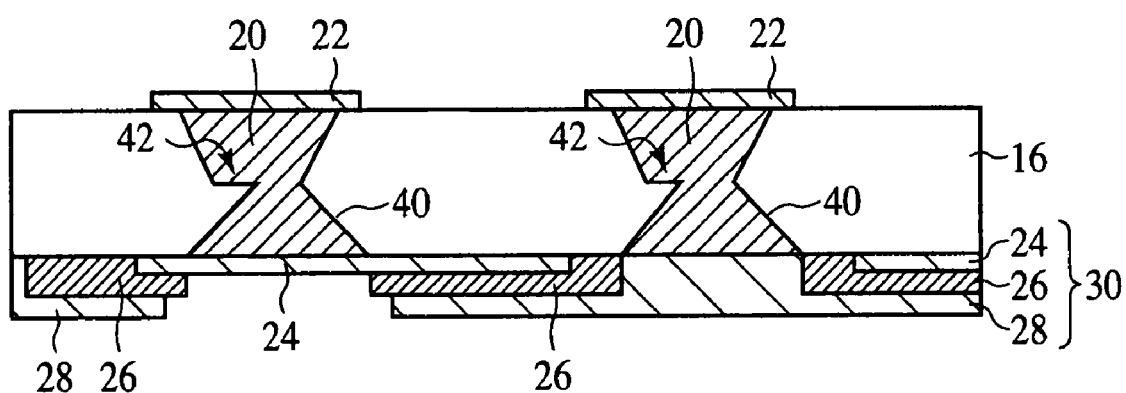
FIG. 6 is a sectional view of the circuit substrate according to a third embodiment of the present invention, which shows a structure thereof.
Figure 7A:
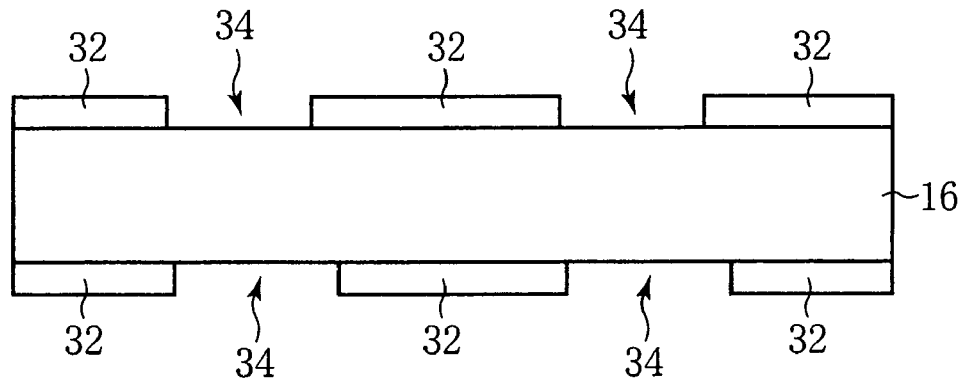
FIGS. 7A, 7B, and 7C are sectional views of the circuit substrate according to the third embodiment of the present invention in the steps of the method for fabricating the same, which show the method.
Figure 7B:
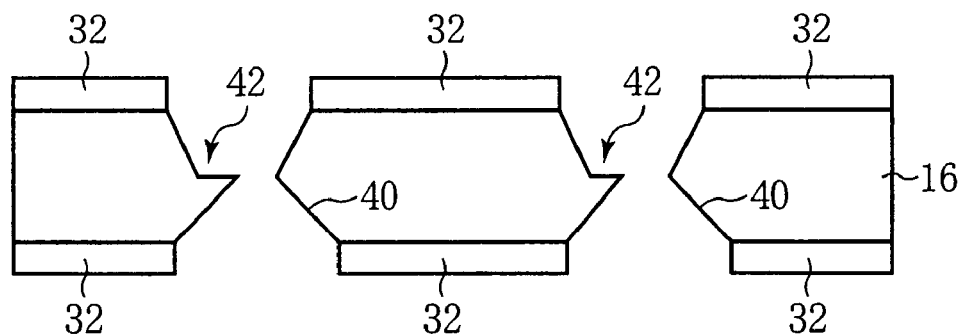
Figure 7C:
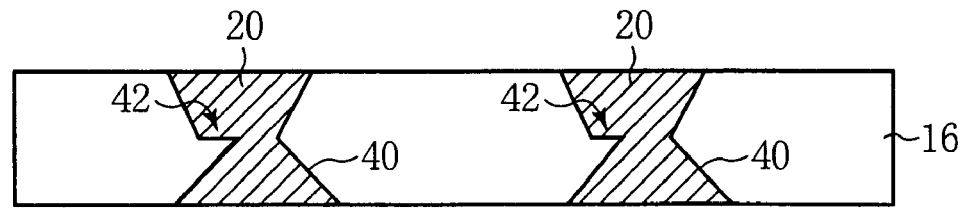

The circuit substrate according to a third embodiment of the present invention and the method for fabricating the circuit substrate will be explained with reference to FIGS. 6, 7A, 7B, and 7C. FIG. 6 is a sectional view of the circuit substrate according to the present embodiment, which shows a structure thereof. FIGS. 7A, 7B, and 7C are sectional views of the circuit substrate according to the present embodiment in the steps of the method for fabricating the same, which show the method. The same members of the present embodiment as those of the circuit substrate according to the first embodiment and the method for fabricating the semiconductor substrate are represented by the same reference numbers not to repeat or to simplify their explanation.

First, the circuit substrate according to the present embodiment will be explained with reference to FIG. 6.

As shown in FIG. 6, in the same way as in the first embodiment, through-holes 40 whose opening width is minimum inside a glass substrate 16 and is increased toward both surfaces of the glass substrate 16 are formed in the glass substrate 16. The inside walls of the through-holes 40 have planes 42 which are substantially parallel to the surfaces of the glass substrate 16. Via electrodes 20 of Pt are buried in the through-holes 40.

As described above, the circuit substrate according to the present embodiment is characterized mainly in that the inside walls of the through-holes 40 have the planes 42 substantially parallel to the surfaces of the glass substrate 16. Because of this characteristic, the detachment of the via electrodes 20 can be effectively prevented.

Next, the method for fabricating the circuit substrate according to the present embodiment will be explained with reference to FIGS. 7A, 7B, and 7C.

First, the dry films 32 are formed on both surfaces of a glass substrate 16.

Then, the openings 34 are formed respectively in the dry films formed on both surfaces of the glass substrate 15 down to the glass substrate 16 by photolithography. At this time, positions where the openings 34 are to be formed in the dry film 32 on the upper surface of the glass substrate 16 and positions where the openings 34 are to be formed in the dry film 32 on the lower surface of the glass substrate 16 are offset from each other (FIG. 7A), and otherwise, a size of the openings 34 in the upper surface of the glass substrate 16 and the a size of the opening 34 in the lower surface may be different from each other.

Then, with the dry films 32 with the openings 34 formed in as a mask, abrasive grains are blasted from both sides of the glass substrate by sand blasting. Thus, the glass substrate 16 in the regions exposed through the openings 34 in the dry films 32 come to be abraded. At this time, a diameter of the abraded parts is decreased gradually away from the surfaces of the glass substrate 16.

At this time, the rate of blasting the abrasive grains and the diameter of the abrasive grains may be changed between the upper surface and the lower surface of the glass substrate 16, so that the glass substrate 16 may be abraded at different aspect ratios from the upper surface of the glass substrate 16 and the lower surface of thereof.

The parts abraded through the openings 34 in the upper surface of the glass substrate 16, and the parts abraded through the openings 34 in the upper surface of the glass substrate 16 come to be connected with each other inside the glass substrate 16 near the thickness-wise middle thereof.

At this time, the positions of the openings 34 are offset from each other between the upper surface of the glass substrate 36 and the lower surface thereof, and otherwise, the glass substrate 16 is abraded at different aspect ratios from the upper surface of the glass substrate 16 and the lower surface thereof. When the parts abraded from the upper surface and the parts abraded from the lower surface are connected with each other, the planes 42 which are substantially parallel with the surfaces of the glass substrate 16 are formed. Thus, the through-holes 40 having the inside walls including the planes 42 substantially parallel with the surfaces of the glass substrate 16 can be formed in the glass substrate 16 (FIG. 7B).

Following this step, in the same way as in the first embodiment, the metal is buried in the through-holes to form the via electrodes 20 (FIG. 7C). Then, the capacitors 30 are formed on the back sides of the glass substrate 16, and the electrode pads 22 are formed on the upper surface of the glass substrate 16.

Thus, the circuit substrate according to the present embodiment is fabricated.

As described above, according to the present embodiment, an opening width of the through-holes 40 is minimum inside the glass substrate near the thickness-wise middle thereof and is increased toward both surfaces of the glass substrate 16, and furthermore, have the inside walls including the planes 42 substantially parallel to the surfaces of the glass substrate 16, whereby the detachment of the via electrodes 42 can be prevented without increasing the surface roughness of the inside walls of the through-holes 40. Stresses generated in the glass substrate 16 by forming burying the metal in the through-holes 18 to form the via electrodes 20 can be mitigated.

[Modifications]

The present invention is not limited to the above-described embodiments and can cover other various modifications.

For example, in the above-described embodiments, the through-holes 18 are formed in a glass substrate 16 and a silicon substrate 36, but a substrate for the through-holes 18 to be formed in is not limited to them. For example, substrates of metal, metal oxide or others can be used. A thickness of the substrates, etc. is 500 μm, but is not essentially limited to 500 μm. The thickness of the substrate may be changed corresponding to sizes the substrate requires.

In the above-described embodiments, the dielectric film 26 is formed of BST, but is not essentially formed of BST. Any dielectric film can be suitably used. A thickness of the dielectric film 26 is 0.2 μm and can be suitably set so that capacitors of required characteristics can be provided.

In the above-described embodiments, the via electrodes 20, and the electrodes 24, 28 forming the capacitors are formed of Pt. A material of the via electrodes 20, etc. is not limited to Pt and can be, e.g., Au, Cu, Pd or others. A thickness of the electrodes 24, 28 can be suitably set so that the capacitors can have required characteristics.

In the above-described embodiments, the through-holes are formed by sand blasting. However, sand blasting is not essential as long as an opening width of the through-holes is minimum inside the substrate and is increased toward the surfaces of the substrate.

In the above-described embodiments, a shape of the through-holes 18 as viewed vertically to the surfaces of the substrate is circular. However, a shape of the through-holes 18 is not essentially circular. A shape of the through-holes 18 can be set corresponding to a size, etc. the circuit substrate must have.

In the above-described embodiments, an opening width of the through-holes 18 is minimum inside the substrate near the thickness-wise middle thereof. However, an opening width of the through-holes 18 must not be minimum essentially inside the substrate near the thickness-wise middle thereof as long as the opening-width is minimum inside the substrate.

Figure 8:
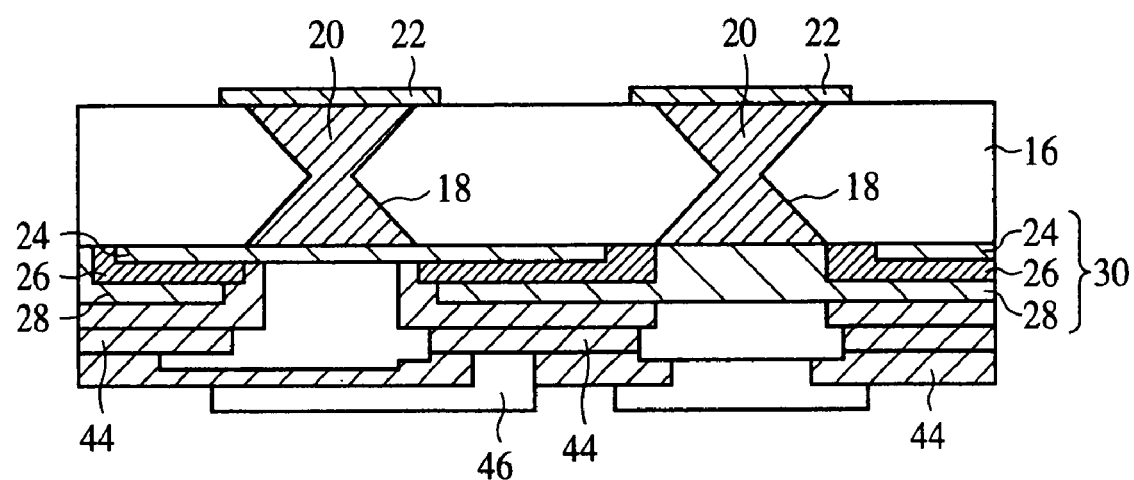
FIG. 8 is a sectional view of the circuit substrate according to a modification of the present invention, which shows a structure thereof.
Figure 9A:
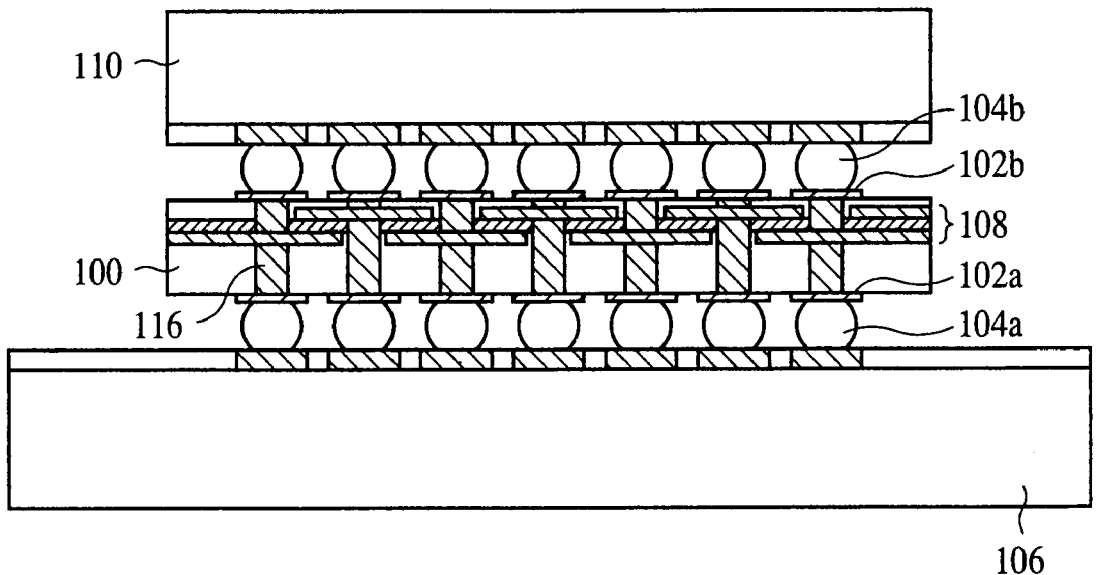
FIGS. 9A and 9B are diagrammatic views of the conventional circuit substrate, which show the structure thereof.
Figure 9B:
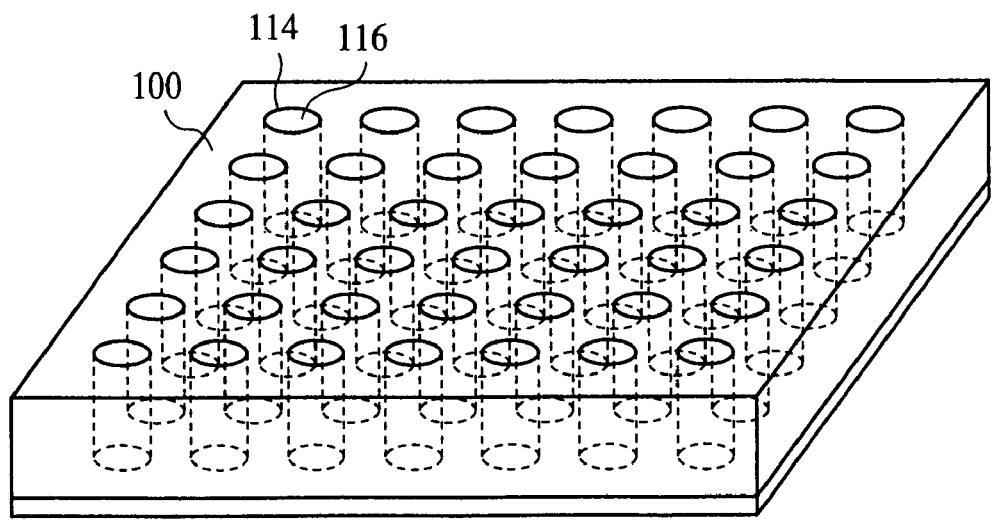

In the above-described embodiments, the electrode pads 22 are formed on the upper surface of the silicon substrate 16 or the glass substrate 36, and on the back surface of the substrates the electrodes 24, the dielectric film 26 and the electrodes 28 are formed. However, this is not essential, and inductors, other inactive elements, active elements, wires, etc. can be suitably formed. As exemplified in FIG. 8, an insulation film 44 of polyimide or others is formed on the back surface of the circuit substrate with the capacitors 30 formed on, and a prescribed wiring pattern 46 may be formed in the insulation film 44 or on the back surface of the insulation film 44.

What is claimed is:

1. A method for fabricating a circuit substrate comprising the steps of forming a through-hole in a core substrate and burying a via electrode in the through-hole,
    in the step of forming the through-hole, the through-hole being defined by an inside wall of the through-hole and being formed so that the inside wall of the through-hole has a plane substantially parallel to the surface of the core substrate at least a part of the inside wall of the through-hole, and that an opening width of the inside wall of the through-hole is minimum inside the core substrate and increased toward both surfaces of the core substrate so that a perpendicular sectional form of the inside wall of the through-hole is made of straight lines all over the other part except for said part of the inside wall.

2. A method for fabricating a circuit substrate according to claim 1, wherein
    in the step of forming the through-hole, abrasive grains are blasted selectively to prescribed regions of the core substrate from both surfaces of the core substrate to form the through-hole.

3. A method for fabricating a circuit substrate according to claim 2, wherein
in the step of forming the through-hole, the regions for the abrasive grains to be selectively blasted to from one surface of the core substrate, and the regions for the abrasive grains to be selectively blasted to from the other surface of the core substrate are offset from each other to form a plane substantially parallel to the surfaces of the core substrate at least a part of an inside wall of the through-hole.

4. A method for fabricating a circuit substrate according to claim 2, further comprising,
after the step of forming the through-hole, the step of etching the inside wall of the through-hole to reduce surface roughness of an inside wall of the through-hole.

5. A method for fabricating a circuit substrate according to claim 3, further comprising,
after the step of forming the through-hole, the step of etching the inside wall of the through-hole to reduce surface roughness of the inside wall of the through-hole.

6. A method for fabricating a circuit substrate according to claim 1, in which the core substrate is conductive; and which further comprises,
after the step of forming the through-hole, the step of forming an insulation film on the inside wall of the through-hole.

7. A method for fabricating a circuit substrate according to claim 2, in which the core substrate is conductive; and which further comprises,
after the step of forming the through-hole, the step of forming an insulation film on the inside wall of the through-hole.

8. A method for fabricating a circuit substrate according to claim 5, in which the core substrate is conductive; and which further comprises,
after the step of forming the through-hole, the step of forming an insulation film on the inside wall of the through-hole.

9. A method for fabricating a circuit substrate according to claim 3, in which the core substrate is conductive; and which further comprises,
after the step of forming the through-hole, the step of forming an insulation film on the inside wall of the through-hole.

10. A method for fabricating a circuit substrate according to claim 4, in which the core substrate is conductive; and which further comprises,
after the step of forming the through-hole, the step of forming an insulation film on the inside wall of the through-hole.

* * * * *